(12) United States Patent
Beamish

(10) Patent No.: US 7,583,765 B2
(45) Date of Patent: Sep. 1, 2009

(54) DC OFFSET DETECTION AND CANCELLATION IN A RECEIVER

(75) Inventor: Norman J. Beamish, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 634 days.

(21) Appl. No.: 11/114,441

(22) Filed: Apr. 26, 2005

(65) Prior Publication Data

US 2006/0239388 A1    Oct. 26, 2006

(51) Int. Cl.
*H03D 1/04* (2006.01)
(52) U.S. Cl. .................................... 375/346
(58) Field of Classification Search ............. 375/316, 375/319, 346; 327/307; 708/313
See application file for complete search history.

(56) References Cited

U.S. PATENT DOCUMENTS

| 5,617,060 | A | 4/1997 | Wilson et al. |
| 6,370,205 | B1 | 4/2002 | Lindoff et al. |
| 2003/0119472 | A1 | 6/2003 | Das |
| 2003/0174079 | A1* | 9/2003 | Soltanian et al. ............ 341/118 |
| 2003/0203728 | A1 | 10/2003 | Filipovic |
| 2004/0043744 | A1 | 3/2004 | Schlegel et al. |
| 2004/0082302 | A1 | 4/2004 | Shippee |
| 2005/0094744 | A1* | 5/2005 | Ramachandran et al. .... 375/316 |

FOREIGN PATENT DOCUMENTS

| EP | 0 863 606 A1 | 9/1998 |
| EP | 0 948 128 A1 | 10/1999 |
| JP | 2003-428958 | 11/2004 |

* cited by examiner

*Primary Examiner*—Sam K Ahn

(57) ABSTRACT

A DC offset detection and cancellation system for a receiver is disclosed. The DC offset detection and cancellation system comprises a downconverter configured to downconvert a received signal to a baseband level signal, the downconverted signal having a first sampling rate, a filter system configured to filter the downconverted received signal at the first sampling rate, and estimator logic configured to sample the downconverted received signal at the first sampling rate to develop a DC estimate signal representative of any direct current (DC) component present on the downconverted received signal, the filter system configured to develop a second sampling rate, where the first sampling rate is significantly higher than the second sampling rate.

12 Claims, 5 Drawing Sheets

DC OFFSET DETECTION AND CANCELLATION IN A RECEIVER

BACKGROUND OF THE INVENTION

1. Field of the Invention

This invention relates generally to receiver circuit architecture in a portable communication device. More particularly, the invention relates to DC offset detection and cancellation in a receiver.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

As these mobile communication systems have been developed and deployed, many different standards, to which these systems must conform, have evolved. For example, in the United States, third generation portable communications systems comply with the IS-136 standard, which requires the use of a particular modulation scheme and access format. In the case of IS-136, the modulation scheme can be 8-quadrature phase shift keying (8QPSK), offset $\pi/4$ differential quadrature phase shift keying ($\pi/4$-DQPSK) or variations thereof and the access format is TDMA.

In Europe, the global system for mobile communications (GSM) standard requires the use of the gaussian minimum shift keying (GMSK) modulation scheme in a narrow band TDMA access environment, which uses a constant envelope modulation methodology.

Furthermore, the need for higher data transmission capability has given rise to enhancing the GSM standard. This relatively new standard is referred to as enhanced data rates for GSM evolution, also referred to as "EDGE." The EDGE standard uses burst-type transmission and a combination of phase and amplitude modulation to increase the amount of data that can be transmitted.

One of the advances in portable communication technology is the move toward the implementation of a low intermediate frequency (IF) receiver and a direct conversion receiver (DCR). A low IF receiver converts a radio frequency (RF) signal to an intermediate frequency that is lower than the IF of a convention receiver. A direct conversion receiver downconverts a radio frequency (RF) received signal directly to baseband (DC) without first converting the RF signal to an intermediate frequency (IF). One of the benefits of a direct conversion receiver is the elimination of costly filter components used in systems that employ an intermediate frequency conversion.

When implementing a low IF or a direct conversion receiver, there is typically some amount of offset (referred to as "DC offset") that appears on the downconverted signal. The DC offset occurs primarily due to self-mixing that can occur with the local oscillator (LO) signal, the radio frequency (RF) signal or interfering signals in the receiver but can also be due to other sources such as circuit bias voltages. Self-mixing among the LO, RF and interfering signals, as well as reflection at the antenna, temperature variation and LO leakage result in dynamic DC offset. For instance, where DC offset is generated by the self-mixing of an LO signal the level of the DC offset will depend on the leakage path, which transfers a portion of the LO signal to the mixer input. This leakage path generally is an unintended, parasitic parameter of the receiver circuit and is dependent on such parameters as manufacturing process variation, device temperature, LO frequency and LO signal level. Many techniques have been proposed to detect and minimize DC offset. For example, it is possible to remove some of the unwanted DC in the analog domain and some in the digital domain (i.e. in the baseband digital receiver). Unfortunately, this solution fails to remove sufficient DC offset in the EDGE communication environment because EDGE uses a burst-type transmission methodology and requires a relatively high signal-to-noise ratio to support the desired data rates. Current techniques to cancel DC offset leave a residual error, thus creating a limiting factor on EDGE receiver performance. The residual error after DC cancellation is directly related to estimating the mean DC associated with a set of relatively noisy data. For purposes of DC offset estimation, the mean is the DC offset and the desired signal is treated as noise.

One prior technique attempts to reduce the level of the DC in the analog domain, but is difficult to implement successfully because the dynamic nature of the DC offset makes it difficult to accurately estimate and thus to remove in the analog domain.

Another possible technique is to estimate the DC offset in the digital domain after the signal has been digitized and sent from the RF receiver to the baseband digital signal processor (DSP) device. Unfortunately, in typical wireless communication systems the sampling rate of the received signal sent to the DSP is reduced from that used within the RF receiver in order to minimize the complexity of the baseband DSP hardware requirements. This means that, in a burst-type transmission system such as EDGE/GSM, the total number of samples sent from the RF receiver to the DSP device is typically too small to allow the burst mean, i.e. the DC offset of the burst, to be estimated to the desired level of accuracy. This is a direct consequence of the Cramer-Rao bound, which states that the accuracy of any technique to measure the mean of a set of noisy data samples is limited by the number of samples in the set. Furthermore this technique requires an expenditure of digital signal processing (DSP) resources in the baseband device. Further, this technique increases the power consumption of the device.

Therefore, it would be desirable to provide DC offset detection and cancellation in a receiver operating in a communication system that can be used for EDGE and other burst-type communication systems.

SUMMARY

Embodiments of the invention include a downconverter configured to downconvert a received signal to a baseband level signal, the downconverted signal having a first sampling rate, a filter system configured to filter the downconverted received signal at the first sampling rate, and estimator logic configured to sample the downconverted received signal at the first sampling rate to develop an estimate of any direct current (DC) component present on the downconverted received signal, the filter system configured to develop a second sampling rate, where the first sampling rate is significantly higher than the second sampling rate.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
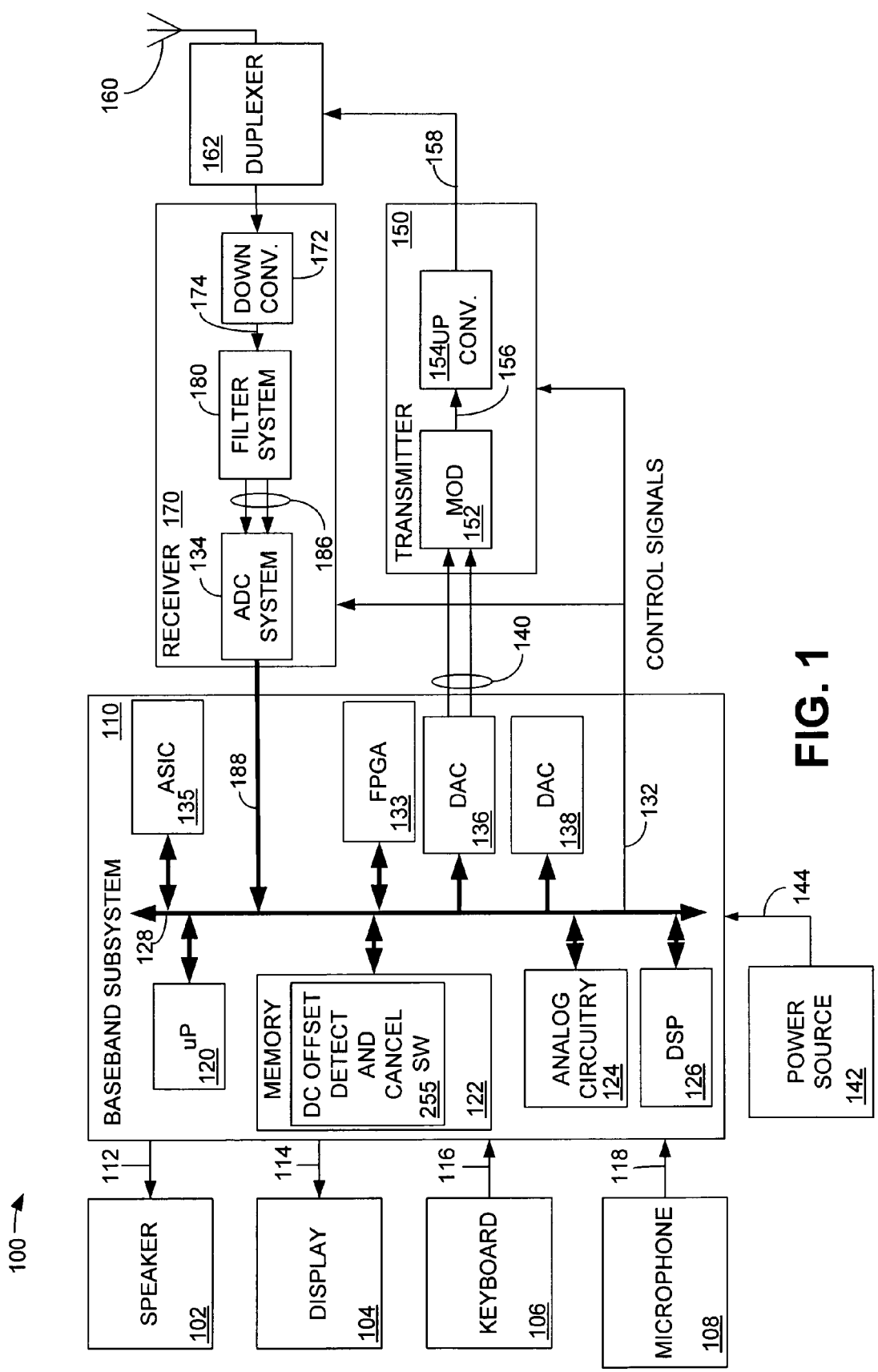
FIG. 1 is a block diagram illustrating a simplified portable transceiver including a DC offset detection and cancellation system in accordance with the invention.

Although described with particular reference to a portable transceiver, the DC offset detection and cancellation system can be implemented in any communication device where the downconverted baseband signal contains an unwanted DC offset component.

The DC offset detection and cancellation system can be implemented in hardware, software, or a combination of hardware and software. When implemented in hardware, the DC offset detection and cancellation system can be implemented using specialized hardware elements and logic. When the DC offset detection and cancellation system is implemented partially in software, the software portion can be used to control the components so that various operating aspects can be software-controlled. The software can be stored in a memory and executed by a suitable instruction execution system (e.g., a microprocessor). The hardware implementation of the DC offset detection and cancellation system can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the DC offset detection and cancellation system comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including a DC offset detection and cancellation system for a direct conversion receiver. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Further, in some implementations, the baseband subsystem 110 may include different components than those described herein. In some implementations, the portable transceiver 100 includes what is referred to as a "mixed signal device." A mixed signal device is one that includes both analog and digital components, and may include components of the baseband subsystem 110, the transmitter 150 and/or the receiver 170.

The speaker 102 and the display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the DC offset detection and cancellation system to be described below is implemented, the baseband subsystem 110 may also include an application specific integrated circuit (ASIC) 135, a field programmable gate array (FPGA) 133, or another processing device.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132. Although shown as a single connection 132, the control signals may originate from the DSP 126, the ASIC 135, the FPGA 133, or from microprocessor 120, and are supplied to a variety of connections within the transmitter 150 and the receiver 170. It should be noted that, for simplicity, only the basic components of portable transceiver 100 are illustrated herein. The control signals provided by the baseband subsystem 110 control the various components within the transmitter 150 and the receiver 170.

If portions of the DC offset detection and cancellation system are implemented in software that is executed by the microprocessor 120, the memory 122 typically will also include the DC offset detection and cancellation software 255. The DC offset detection and cancellation software 255 comprises one or more executable code segments that can be stored in the memory and executed in the microprocessor 120 or in another processor. Alternatively, the functionality of the DC offset detection and cancellation software 255 can be coded into the ASIC 135 or can be executed by the FPGA 133, or another processor. Because the memory 122 can be rewritable and because the FPGA 133 is reprogrammable, updates to the DC offset detection and cancellation software 255 can be remotely sent to and saved in the portable transceiver 100 when implemented using either of these methodologies.

The baseband subsystem 110 also includes digital-to-analog converters (DACs) 136 and 138. Although DACs 136 and 138 are illustrated as two separate devices, it is understood that a single digital-to-analog converter may be used that performs the function of DACs 136 and 138. The DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 156 to upconverter 154. The upconverter 154 transforms and amplifies the modulated signal on connection 156 to an appropriate transmit frequency and power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature-phase (Q) components. The I and Q components may take different forms and be formatted differently depending upon the communication standard being employed.

The upconverter 154 supplies the upconverted signal via connection 158 to duplexer 162. The duplexer comprises a filter pair that allows simultaneous passage of both transmit signals and receive signals, as known to those having ordinary skill in the art. The transmit signal is supplied from the duplexer 162 to the antenna 160.

A signal received by antenna 160 will be directed from the duplexer 162 to the receiver 170. The receiver 170 includes a downconverter 172, a filter system 180 constructed in accordance with an aspect of the invention. The downconverter 172 includes a low-noise amplifier (LNA) (not shown) and circuitry (not shown) to convert the received signal from an RF level to a baseband level (DC). The baseband signal is sent to the filter system 180 via connection 174. The filter system 180 comprises a number of different components that filter the downconverted signal and provide the downconverted signal in a quadrature format to the analog-to-digital converter (ADC) system 134 via connection 186. The components in the filter system 180 will be described in further detail below.

The ADC system 134 converts these analog signals to a digital signal at baseband frequency and transfers the signal via connection 188 to the baseband system bus 128 where it may be transferred to DSP 126 for further processing. The ADC system 134 can also be located within baseband subsystem 110 without affecting the operation of the present invention.

Figure 2:
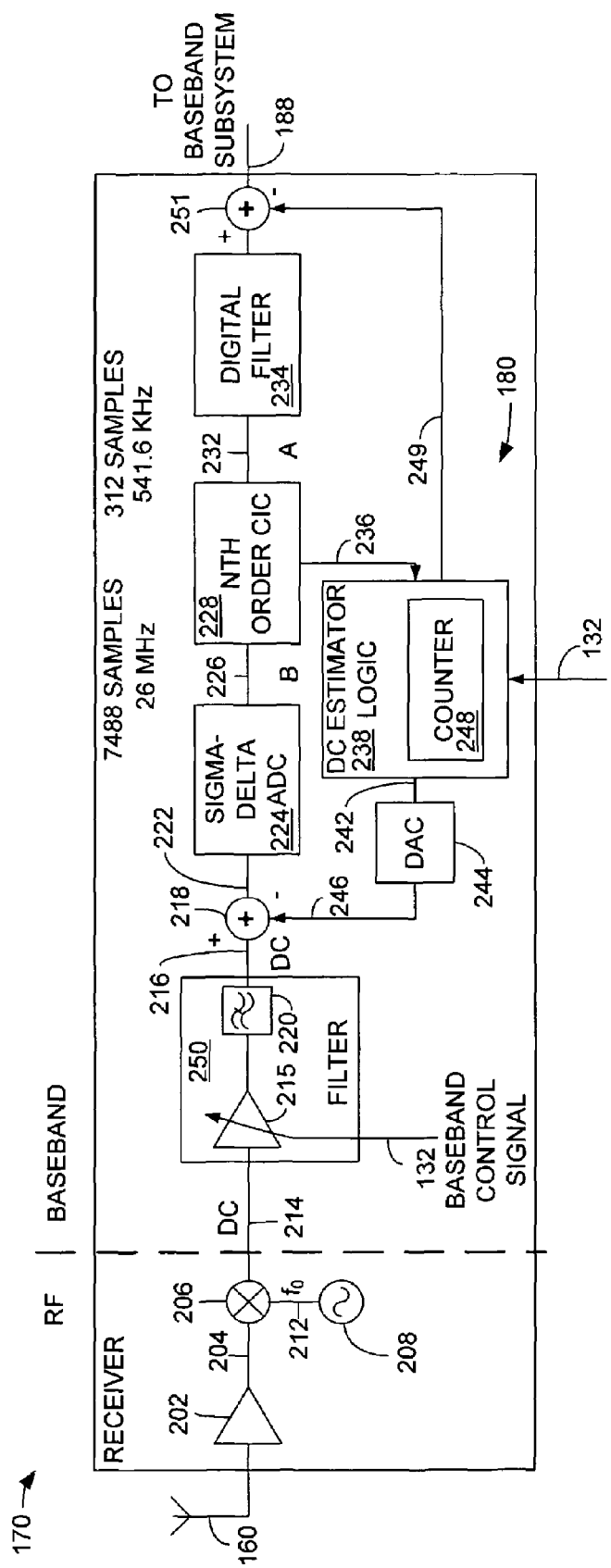
FIG. 2 is a block diagram illustrating the receiver of FIG. 1.

FIG. 2 is a block diagram illustrating, in greater detail, the receiver 170 of FIG. 1. The receiver 170 receives a signal via antenna 160, which supplies the received signal at an RF frequency level via the duplexer (not shown) to low noise amplifier (LNA) 202. The LNA 202 amplifies the received signal and provides the amplified signal on connection 204 to the mixer 206. The mixer 206 receives a frequency reference signal, also called a "local oscillator" signal, or "LO," from a synthesizer 208, via connection 212. The LO signal determines the frequency to which the mixer 206 downconverts the signal received from LNA 202 via connection 204. In the case of a direct conversion receiver, the mixer 206 downconverts the received RF signal to a DC signal on connection 214. For illustrative simplicity only one component of the quadrature path is shown in FIG. 2. As known to those skilled in the art, each component of the quadrature path is processed in the same manner according to embodiments of the invention.

The signal on connection 214 is then supplied to at least one filter stage 250. The filter stage 250 comprises a variable gain amplifier (VGA) 215 and a filter 220. The filter 220 can be referred to as a so-called "bi-quad" filter because of it's configuration to generate complex poles and zero's.

The DC signal on connection 214 is supplied to variable gain amplifier 215. The variable gain amplifier 215 receives a control signal via connection 132 from the baseband subsystem 110 (FIG. 1). The variable gain amplifier 215 amplifies the signal on connection 214, and supplies the amplified signal to the filter 220. The filter 220 is, in this embodiment, a low-pass filter, which filters the signal to provide the desired signal output. When converted to baseband, the DC signal on connection 216 likely includes undesirable DC offset. If the DC offset is not corrected, then the DC offset will degrade the ability of the receiver system to recover the transmitted information contained within the received signal. This corruption of the received signal can occur in two particular ways.

First, the digitization process, implemented by the analog-to-digital converter (ADC) 224, will be compromised if the DC offset is too large. This is because the fidelity of the ADC conversion process requires that the amplitude of the signal at the ADC input lie within maximum positive and maximum negative limits. These limits are a consequence of the practical construction of the ADC. If the input signal lies beyond these limits the ADC output will be significantly distorted and any further receiver operations will be greatly impaired.

The second way in which DC offset will impair the receiver is by degrading the capability of the post-ADC signal processing to distinguish between different types of transmitted information in the received data. For example, in a simple binary pulse amplitude modulation (PAM) system the receiver recovers the transmitted information from the received signal by examining the polarity of the received signal. A positive polarity indicates the transmitted bit is a '1' and a negative polarity indicates a bit '0'. In an ideal scenario with no noise added to the transmitted signal the amplitude of the signal representing each transmitted bit will be constant voltage (V) and the polarity will carry the transmitted information. After noise is added to the transmitted signal the receiver will still be able to recover the transmitted information as long as the added noise never exceeds the value V. Therefore the value V can be considered as representative of the noise immunity of the transmitted signal and it is independent of the polarity of the transmitted signal. However, once a DC offset is added to the received signal the receiver will now be biased to select one polarity over the other. This will reduce the noise immunity of the system and degrade the quality of the communication link by increasing the bit error rate (BER). Once the DC offset exceeds the value V the receiver will always choose the same result for all received signals regardless of the signal that is transmitted. This clearly indicates that a residual DC offset added to the signal degrades the recovery of the transmitted information. Furthermore as the complexity of the transmitted signal is increased (e.g. 2-PAM to 8-PSK) the equivalent noise immunity is reduced and therefore the level of DC offset required to degrade the receiver performance is consequently smaller.

Figure 3:
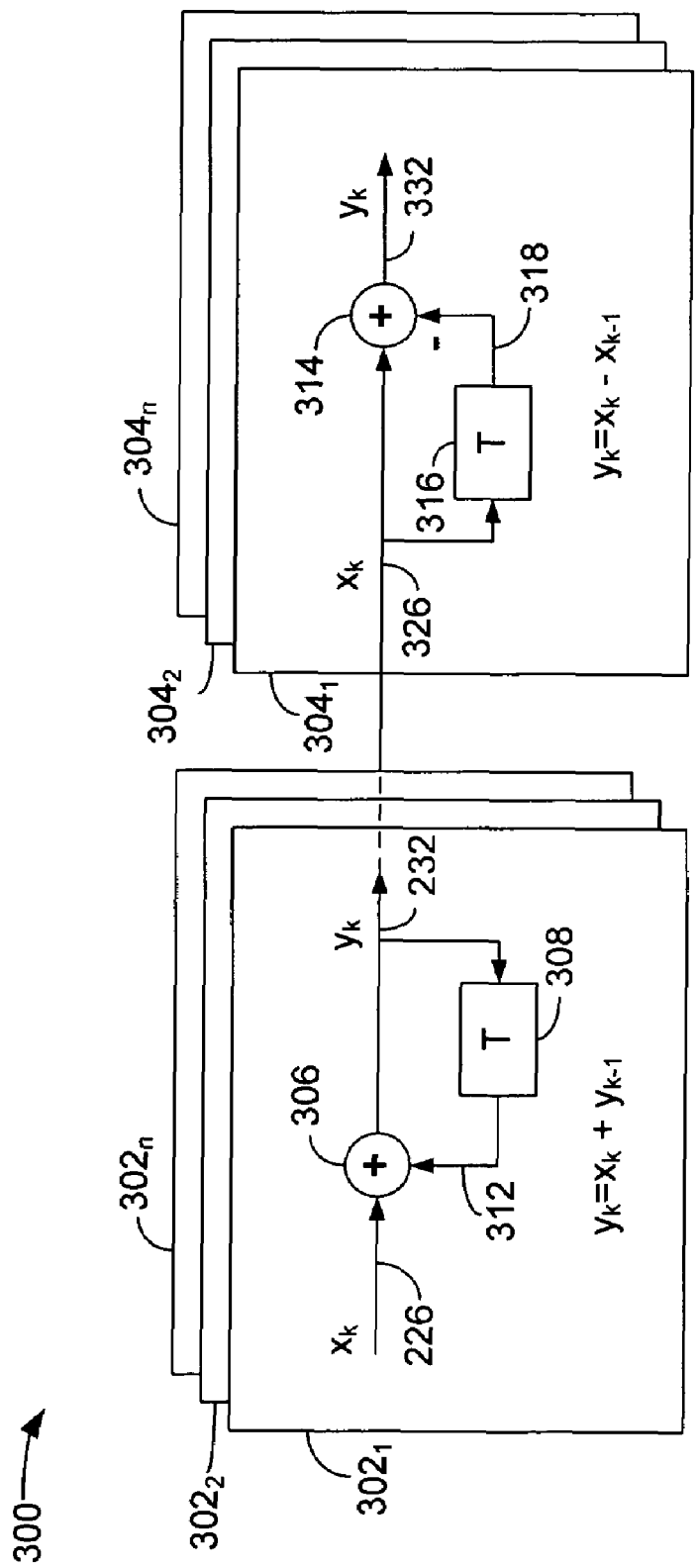
FIG. 3 is a block diagram illustrating a plurality of integrators and a plurality of differentiators associated with the CIC filter of FIG. 2.

The output of the filter stage 250 on connection 216 is supplied through a subtractor 218 and via connection 222 to a sigma-delta analog-to-digital converter (ADC) 224. It will be clear to those skilled in the art that while the ADC structure shown in the embodiment of FIG. 3 is a sigma-delta ADC, ADC structures other than sigma-delta can also be used within the scope of this invention. The sigma-delta ADC 224 converts the analog signal on connection 222 to a digital signal on connection 226 where it is supplied to an $n^{th}$ order cascaded integrator comb (CIC) filter 228. The CIC filter 228 receives a high sample rate signal on connection 226, filters the signal, and provides a lower sample rate signal on connection 232. For example, the signal on connection 226 can be at an exemplary frequency of 26 MHz, which, in this example, corresponds to 7488 samples in one EDGE burst interval. After being processed by the CIC filter 228, the filtered signal on connection 232 is at a frequency of, for example, approximately 541.6 kilohertz (kHz) which corresponds to 312 samples in one EDGE burst interval. More importantly, the input to the CIC filter 228 on connection 226 is at a sampling rate that is substantially higher than the sampling rate of the signal on connection 232.

In accordance with an embodiment of the invention, the CIC filter 228 is used to sample the signal on connection 226 at the higher sampling rate. The CIC filter 228 comprises a number of integrators and differentiators (shown below in FIG. 3) that can be used to provide an estimate of the DC offset that is present on the signal on connection 226.

An output of the CIC filter 228 is provided on connection 236 to the DC estimator logic 238. The DC estimator logic 238 includes a counter 246 configured to track the number of samples that have been processed by the CIC filter 228. The DC estimator logic 238 also receives a control signal via connection 132 from, for example, the DSP 126 of FIG. 1. The DSP 126, via connection 132, programs the length of the measurement period over which the CIC filter 228 will be used in the DC offset measurement process. The measurement period can correspond to the length of a transmission burst of the communication system in which the portable transceiver 100 (FIG. 1) is operating or it may be configured to be some other interval which may be smaller or larger than the duration of a transmission burst.

Although not required, it is also desirable that the contents of the integrators and differentiators within the CIC filter 228 be set to zero at the start of a measurement period and that the CIC filter 228 have sufficient bits of storage available so that the contents will not wrap during a measurement period. Wrapping is a well known feature of some forms of binary arithmetic.

The output of the DC estimator logic 238 on connection 242 is a digital signal representing an estimate of the DC offset present on connection 226. The digital DC offset estimate signal is supplied to a digital-to-analog converter (DAC) 244 which converts the signal to an analog signal and which supplies the analog version of the DC offset estimate as a correction signal via connection 246 to the subtractor 218.

The DC offset estimate is subtracted from the downconverted received signal on connection 216. In some embodiments the resolution of the DAC 244 will be too coarse to adequately cancel the DC offset. In these cases the DC offset is partially cancelled using DAC 244 and the subtractor 218 and the residual DC offset is removed by sending a digital estimate of this residual DC offset from the DC estimator logic 238 over connection 249 to subtractor 251. Three possible embodiments of the invention can be implemented by choosing different combinations of the two subtraction techniques mentioned above. For example, analog DC offset cancellation, digital DC offset cancellation, or a combination of analog and digital DC offset cancellation can be implemented.

The output of the CIC filter 228 on connection 232 is supplied to a digital filter 234, which provides additional filtering, and supplies the filtered signal on connection 188 where it is sent to the baseband subsystem 110 (FIG. 1).

FIG. 3 is a block diagram 300 illustrating a plurality of integrators 302 and a plurality of differentiators 304 which comprise the CIC filter 228 of FIG. 2. The integrators 302 and the differentiators 304 can be logic that is located within the CIC filter 228 of FIG. 2, or elsewhere in the receiver 170. Typically the integrators 302 will operate at the high sample rate and the output of the final integrator will be downsampled to the low sample rate and the differentiators 304 will operate at this lower rate. It is also possible to operate one or other of the differentiators at the high sample rate. In accordance with an embodiment of the invention, the first integrator ($302_1$) in the CIC filter 228 is operated at the high sample rate. Any number (n) of integrators 302 and differentiators 304 can be used. For example purposes only a single integrator $302_1$ and a single differentiator $304_1$ will be described. The integrator $302_1$ receives an input signal referred to as "$x_k$" on connection 226. The signal $x_k$ is supplied to an adder 306. The output of the adder is referred to as "$y_k$" and is provided on connection 232 to the digital filter 234 of FIG. 2. The integrator $302_1$ takes the output signal on connection 232 and supplies it as feedback to a delay element 308. In this example, the delay element 308 has a duration of one sample period. The output of the delay element 308 is supplied as feedback on connection 312 to the adder 306. With regard to the integrator $302_1$, the output $y_k = x_k + y_{k-1}$.

The differentiator 304 receives the $x_k$ input signal on connection 326 and supplies it to an adder 314. The output of the adder 314 on connection 332 is the signal $y_k$. The input signal $x_k$ on connection 326 is also supplied to a delay element 316. The delay element 316 delays the signal on connection 326 by one sample period and supplies an output on connection 318 to the adder 314. The adder 314 subtracts the signal on connection 318 from the signal on connection 326 and follows the logic $y_k = x_k - x_{k-1}$. The first of the integrators 302 is used to measure the DC offset on connection 226 at the higher sampling frequency present on connection 226.

Figure 4:
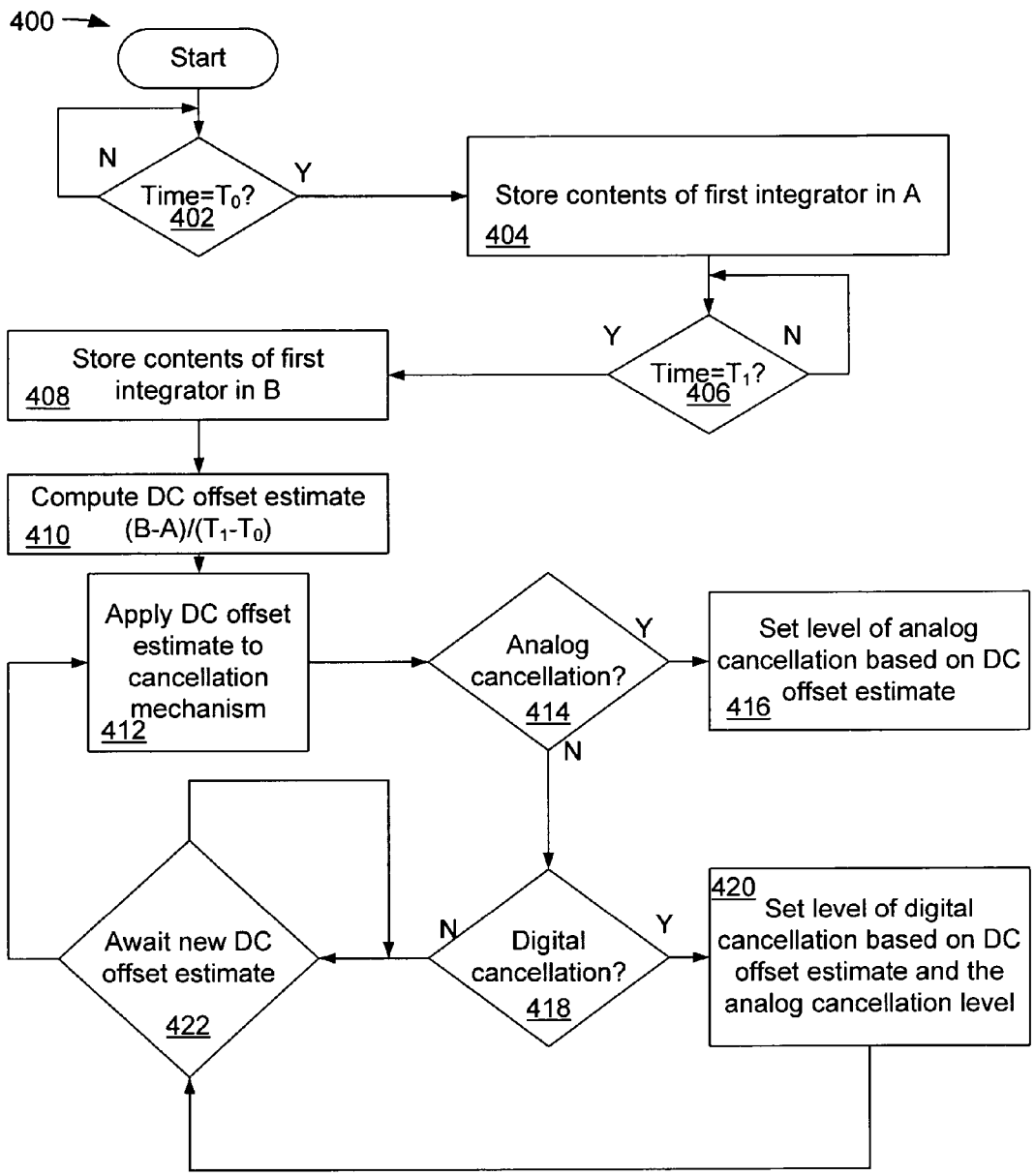
FIG. 4 is a flow chart describing the operation of an embodiment of the DC offset detection and cancellation system.

FIG. 4 is a flow chart 400 describing the operation of an embodiment of the DC offset detection and cancellation system. Any process descriptions or blocks in flow chart should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention. In block 402, it is determined if the counter 248 is set to a preset value represented as $T_0$. The DC estimator logic 238 will continue to monitor the counter 248 until the preset value $T_0$ is reached. When the counter 248 reaches the value $T_0$ the DC estimator logic 238 will copy the contents of the $1^{st}$ integrator ($302_1$) in the CIC filter 228 to a storage location labeled A as shown in block 404. The DC estimator logic then enters the operational state represented in block 406 whereby the DC estimate logic 238 monitors the counter 248 until a second preset value (represented as $T_1$) is reached.

When the counter 248 reaches the value $T_1$ the DC estimator logic 238 will copy the contents of the $1^{st}$ integrator ($302_1$) in the CIC filter 228 to a storage location labeled B as shown in block 408. In block 410 the DC estimator logic 238 computes an estimate of the DC offset by determining the difference between the stored quantities B and A and dividing the difference by the elapsed time interval between time instants $T_0$ and $T_1$. It will be clear that the values $T_0$ and $T_1$ can be dynamically programmed to achieve varying levels of accuracy in the estimate of the DC offset.

Typically, the time instants $T_0$ and $T_1$ are represented as integer quantities where each unit quantity represents the time interval associated with one sample of the ADC output signal at connection 226. In one embodiment, the counter 248 uses modulo-N arithmetic so that after N unit time intervals have elapsed the counter 248 will contain the same value as it did N unit time intervals previously. In another embodiment, the number of unit time intervals between $T_0$ and $T_1$ is chosen as an integer power of 2. This allows the calculation of the DC offset estimate to be simplified.

In block 412 the DC offset estimate is used to cancel the DC offset. In block 414, it is determined whether an analog DC offset cancellation is to be used. In this embodiment, the output of the DC estimator logic 238 is supplied to the DAC 244 and in block 416, the level of analog DC offset cancellation is set based on the DC offset estimate signal. If analog cancellation is not enabled, then, in block 418, it is determined whether digital DC offset cancellation is to be applied. In this embodiment, the output of the DC estimator logic 238 is supplied to the subtractor 251, and in block 420, the level of digital DC offset cancellation is set based on the DC offset estimate signal and on the level of analog cancellation. In block 422, the DC cancellation programming is active based on the existing DC offset estimate until a new estimate of the DC offset is available. When a new DC offset estimate is available, the process returns to block 412.

Figure 5:
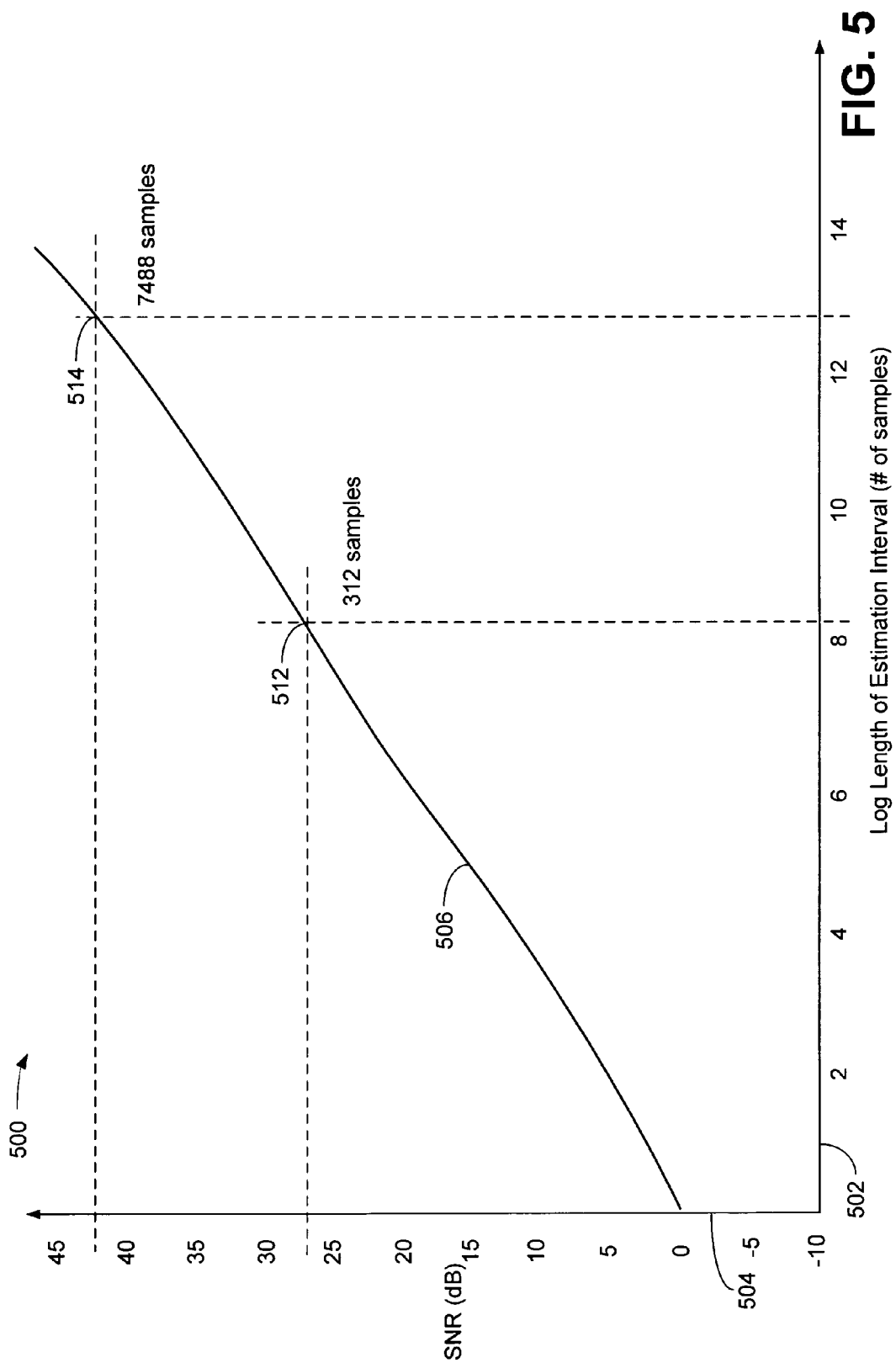
FIG. 5 is a graphical view illustrating the mean signal-to-noise ratio of a received signal processed at different sampling rate as described above.

FIG. 5 is a graphical view 500 illustrating the mean signal-to-noise ratio of a received signal processed at different sampling rates as described above. The horizontal axis 502 represents the logarithmic length of the estimation interval (number of samples) and the vertical axis 504 represents signal-to-noise ratio (in dB) where the DC offset is the signal and the noise is the difference between the actual and estimated DC offset, i.e. the estimation error. The curve 506 represents the mean signal-to-noise ratio at the output of the DC offset estimator logic 238 versus the length of the estimation interval. The point 512 on the curve 506 illustrates that a signal-to-noise ratio of approximately 27 dB is obtained when the DC offset estimate is calculated over an estimation interval comprising 312 samples. This interval of 312 samples corresponds to the number of samples in a GSM/EDGE burst at a low sampling rate. The point 514 illustrates a mean signal-to-noise ratio of approximately 42 dB when the DC offset is estimated over an interval of 7488 samples. This interval of 7488 samples corresponds to the number of samples in a GSM/EDGE burst at a high sampling rate. For example, as described above, performing a DC offset estimation at a high sample rate results in improved accuracy of the estimate when compared to a DC offset estimation performed at a low sampling rate as shown in FIG. 5.

While various embodiments of the invention have been described, it will be apparent to those of ordinary skill in the art that many more embodiments and implementations are possible that are within the scope of this invention. For example, other processing resources can be used to measure the high rate samples for a DC component. Accordingly, the invention is not to be restricted except in light of the attached claims and their equivalents.

What is claimed is:

1. A method for detecting and canceling DC offset in a receiver, comprising:
    downconverting a received signal to a baseband level signal;
    providing the baseband level signal to a first filter system to generate a first filtered signal;
    converting the first filtered signal to a digital signal at a first sampling rate to develop a DC estimate signal representative of any direct current (DC) component present on the downconverted received signal;
    providing the digital signal to a second filter system to generate a second filtered signal and develop a second sampling rate, where the first sampling rate is significantly higher than the second sampling rate;
    developing the DC estimate signal in the digital domain;
    converting the DC estimate signal to an analog signal;
    applying the analog DC estimate signal to cancel any DC component present on the downconverted received signal; and
    applying the DC estimate signal in the digital domain to cancel any residual DC component present on the downconverted received signal.

2. The method of claim 1, further comprising subtracting the analog estimate of the DC component from the downconverted received signal to minimize any DC component on the downconverted received signal.

3. The method of claim 1, further comprising sampling the downconverted received signal at 26 megahertz (MHz).

4. A DC offset detection and cancellation system for a receiver, comprising:
    a downconverter configured to downconvert a received signal to a baseband level signal;
    a first filter system configured to filter the baseband level signal to generate a first filtered signal;
    an analog-to-digital converter system configured to convert the first filtered signal to a digital signal at a first sampling rate;
    a second filter system configured to generate a second filtered signal in response to the digital signal at a second sampling rate, where the first sampling rate is significantly higher than the second sampling rate;
    estimator logic coupled to the second filter system and configured to develop a DC estimate signal representative of any direct current (DC) component present on the downconverted received signal;
    logic configured to develop the DC estimate signal in the digital domain;
    a digital-to-analog converter configured to convert the DC estimate signal to an analog signal;
    a first subtractor configured to apply the analog DC estimate signal to cancel any DC component present on the downconverted received signal; and
    a second subtractor configured to apply the DC estimate signal in the digital domain to cancel any residual DC component present on the downconverted received signal.

5. The DC offset detection and cancellation system of claim 4, further comprising a subtractor configured to subtract the analog estimate of the DC component to the downconverted received signal to minimize any DC component on the downconverted received signal.

6. The DC offset detection and cancellation system of claim 4, wherein the downconverted received signal is sampled at 26 megahertz (MHz).

7. A portable transceiver, comprising:
   a transmitter configured to modulate and transmit a data signal;
   a receiver configured to receive a received signal, the receiver comprising:
   a downconverter configured to downconvert a received signal to a baseband level signal;
   a first filter system configured to filter the baseband level signal to generate a first filtered signal;
   an analog-to-digital converter system configured to convert the first filtered signal to a digital signal at a first sampling rate;
   a second filter system configured to generate a second filtered signal in response to the digital signal at a second sampling rate, where the first sampling rate is significantly higher than the second sampling rate;
   estimator logic coupled to the second filter system and configured to develop a DC estimate signal representative of any direct current (DC) component present on the downconverted received signal;
   logic configured to develop the DC estimate signal in the digital domain;
   a digital-to-analog converter configured to convert the DC estimate signal to an analog signal;
   a first subtractor configured to apply the analog DC estimate signal to cancel any DC component present on the downconverted received signal; and
   a second subtractor configured to apply the DC estimate signal in the digital domain to cancel any residual DC component present on the downconverted received signal.

8. The portable transceiver of claim 7, further comprising a subtractor configured to subtract the analog estimate of the DC component to the downconverted received signal to minimize any DC component on the downconverted received signal.

9. The portable transceiver of claim 7, wherein the downconverted received signal is sampled at 26 megahertz (MHz).

10. A portable transceiver, comprising:
    means for modulating and transmitting a data signal;
    means for downconverting a received signal to a baseband level signal;
    means for providing the baseband level signal to a first filter system to generate a first filtered signal;
    means for sampling the first filtered signal at the first sampling rate to develop a DC estimate signal representative of any direct current (DC) component present on the downconverted received signal;
    means for filtering the sampled first filter signal using a second filter system to develop a second sampling rate, where the first sampling rate is significantly higher than the second sampling rate;
    means for developing the DC estimate signal in the digital domain;
    means for convening the DC estimate signal to an analog signal;
    means for applying the analog DC estimate signal to cancel any DC component present on the downconverted received signal; and
    means for applying the DC estimate signal in the digital domain to cancel any residual DC component present on the downconverted received signal.

11. The portable transceiver of claim 10, further comprising means for subtracting the analog estimate of the DC component to the downconverted received signal to minimize any DC component on the downconverted received signal.

12. The portable transceiver of claim 10 further comprising means for sampling the downconverted received signal at 26 megahertz (MHz) at a bit rate of 7488 samples per second.

\* \* \* \* \*